United States Patent
Ciraula et al.

[11] Patent Number: 5,818,264
[45] Date of Patent: Oct. 6, 1998

[54] DYNAMIC CIRCUIT HAVING IMPROVED NOISE IMMUNITY AND METHOD THEREFOR

[75] Inventors: Michael Kevin Ciraula, Round Rock; Donald George Mikan, Jr., Austin, both of Tex.

[73] Assignee: International Business Machines Corporation, Armonk, N.Y.

[21] Appl. No.: 767,773

[22] Filed: Dec. 17, 1996

[51] Int. Cl.⁶ .................................................. H03K 19/096
[52] U.S. Cl. .................................................. 326/98; 326/83
[58] Field of Search ................. 326/23, 24, 98, 326/83, 121, 95; 327/215, 218, 219, 333, 391

[56] References Cited

U.S. PATENT DOCUMENTS

| | | | |
|---|---|---|---|
| 4,825,106 | 4/1989 | Tipon et al. | 326/121 |
| 4,866,307 | 9/1989 | Ashmore, Jr. | 326/121 |
| 4,958,088 | 9/1990 | Farah-Bakhsh et al. | |
| 5,117,133 | 5/1992 | Luebs | 326/83 |
| 5,151,616 | 9/1992 | Komuro | 326/121 |
| 5,151,622 | 9/1992 | Thrower et al. | 326/83 |
| 5,194,767 | 3/1993 | Chao . | |
| 5,465,054 | 11/1995 | Erhart . | |
| 5,650,733 | 7/1997 | Covino | 326/24 |

FOREIGN PATENT DOCUMENTS

| | | |
|---|---|---|
| 59-49020 | 3/1984 | Japan . |
| 63-10913 | 1/1988 | Japan . |
| 2-119443 | 5/1990 | Japan . |

OTHER PUBLICATIONS

U.S. Patent Application Serial No., entitled "Dynamic CMOS Circuits with Noise Immunity" (Attorney Docket No. BU9–95–066).

*Primary Examiner*—Jon Santamauro
*Assistant Examiner*—Don Phu Le
*Attorney, Agent, or Firm*—Winstead Sechrest & Minick P.C.; Anthony V. S. England

[57] ABSTRACT

A dynamic circuit has an improved noise margin that is not solely dominated by a threshold voltage of the transistors from which it is comprised. A transistor is utilized such that a ratio of the width of the feedback device to a pull-down transistor in a dynamic circuit determines when the pull-down transistor becomes active and conducts current. Therefore, rather than having a low threshold voltage which may be significantly and substantially impacted by the presence of noise on an input signal, beta ratioed transistors are implemented to give greater noise immunity and increase a circuit's ability to tolerate noisy input lines. Furthermore, a structure of the dynamic circuit of the dynamic circuit preserves the functionality of that circuit. More specifically, after a dynamic node of a circuit of the present invention has been discharged, the node remains discharged and is only precharged again when a subsequent clock pulse occurs.

7 Claims, 6 Drawing Sheets

DYNAMIC CIRCUIT HAVING IMPROVED NOISE IMMUNITY AND METHOD THEREFOR

CROSS-REFERENCE TO RELATED APPLICATION

Related subject may be found in the commonly assigned, co-pending U.S. patent application, which is incorporated by reference herein:

Ser. No. 08/547,269, entitled "DYNAMIC CMOS CIRCUITS WITH NOISE IMMUNITY" and issued as U.S. Pat. No. 5,650,733 on Jul. 22, 1997, which was filed Oct. 24, 1995.

TECHNICAL FIELD

The present invention relates in general to a dynamic circuit, and in particular, to a noise immunity of the dynamic circuit.

BACKGROUND INFORMATION

Dynamic and domino logic circuits are well-known in the semiconductor data processing art. Basically, dynamic circuits require a two-phase operation. In a first phase, the dynamic circuit is precharged and in a second phase, the dynamic circuit is evaluated. While such dynamic circuits provide quick operation with lower power consumption than their static counterparts, dynamic circuits are particularly susceptible to noise on an input signal. Such noise includes unwanted electrical signals which occur within the circuit and results in spurious signals occurring at an output of the circuit. With dynamic circuits, in particular, such noise on an input may cause a precharged node therein to discharge and an erroneous output will be provided when the noise rises above the threshold voltage of the transistors comprising the dynamic circuit.

The threshold voltage of a transistor in a semiconductor device is determined by a method used to manufacture the device, including any process variations therein. It is inherent in the data processing field that processing parameters and techniques will vary within a semiconductor manufacturing facility. As each of these variations affects the parameters which determine a threshold voltage of devices manufactured therein, it is difficult for engineers to accurately and precisely determine a noise immunity of the manufactured devices unless that threshold voltage is factored into the equations used to model the manufactured devices. Thus, input signals which have a slight level of noise that might not cause erroneous results in some semiconductor devices, will cause defects and erroneous results on the same devices manufactured on a different day.

Furthermore, when the threshold voltages of the devices on a semiconductor wafer are increased to increase a noise immunity of the circuits manufactured thereon, the current carrying capability of the devices is diminished and the delay associated with the circuit is increased. An approach which modifies the threshold voltages of the devices is problematic in that different circuits require different noise tolerances. For example, a circuit whose input connects to a long conductive line, or wire, must have a high noise tolerance because the long wire will couple noise to the circuit's input. In contrast, a circuit whose input comes from a short distance will require a much lower noise immunity because there is much less potential for noise to be coupled to the circuit's input. Thus, setting a threshold voltage high enough to provide adequate noise immunity for the circuits exposed to the most noise adversely affects a delay associated with the remaining circuits.

Thus, there is a need in the data processing art for a dynamic circuit configuration which has improved noise immunity that is not dependent upon processing variations and which performs in conformance with an expected behavior of domino circuits.

SUMMARY OF THE INVENTION

The previously mentioned needs are fulfilled with the present invention. Accordingly, there is provided, in one form, a dynamic circuit. The dynamic circuit includes a clock input circuit which receives a clock signal. The dynamic circuit also includes a data input circuit for receiving a data signal. The data input circuit includes a first device connected to the clock input circuit and a second device. An output circuit for providing an output signal is also included in the dynamic circuit. A feedback device is connected to the output circuit and the second device of the data input circuit.

Additionally, there is provided, in a second form, a method for operating a dynamic circuit. The method for operating the dynamic circuit includes the steps of receiving a clock signal at a clock input circuit, and receiving a data signal at a data input circuit. The data input circuit includes a first device connected to the clock input circuit and the second device. The method also includes a step of providing an output signal at an output circuit and connecting a feedback device to the output circuit and the second device of the data input circuit.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The present invention provides a dynamic circuit which has an improved noise margin that is not solely dominated by a threshold voltage of the transistors from which it is comprised. A transistor is utilized such that a ratio of the width of the feedback device to a pull-down transistor in a dynamic circuit determines when the pull-down transistor becomes active and conducts current. Thus, a ratio of sizes of a transistor and not merely the threshold voltage of the pull-down transistor, determines the conditions on which the pull-down transistor begins to conduct. Therefore, rather than having a low threshold voltage which may be significantly and substantially impacted by the presence of noise on an input signal, ratioed transistors are implemented to give greater noise immunity and increase a circuit's ability to tolerate noisy input lines. Furthermore, a structure of the dynamic circuit of the present invention preserves the functionality of dynamic circuits. More specifically, after a dynamic node of a circuit of the present invention has been discharged, the node remains discharged and is only precharged again when a subsequent clock pulse occurs.

During a description of the implementation of the invention, the terms "assert" and "negate," in various grammatical forms thereof, are used to avoid confusion when dealing with the mixture of "active high" and "active low" logic signals. "Assert" is used to refer to the rendering of a logic signal or register bit into its active, or evaluated state. "Negate" is used to refer to the rendering of a logic signal or register bit into its inactive, or precharged state. Furthermore, in the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Description of Connectivity

Figure 1:
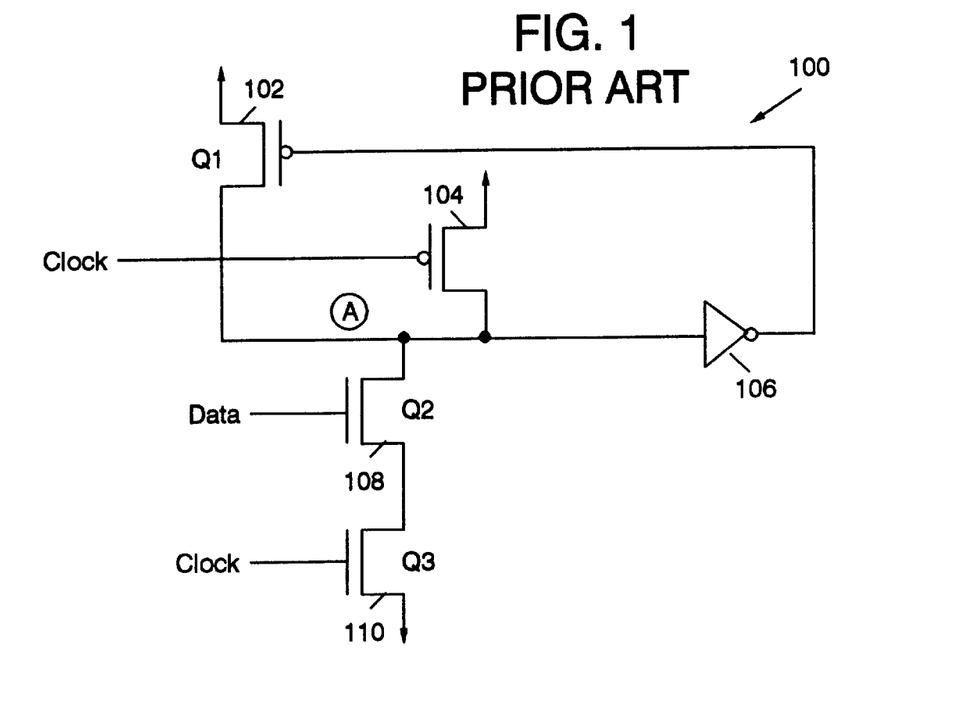
FIG. 1 illustrates, in circuit diagram form, a prior art buffer configuration.

FIG. 1 illustrates a prior art buffer 100. Prior art buffer 100 comprises a first transistor 102, a second transistor 104, a third transistor 108, a fourth transistor 110, and an inverter 106. A first electrode of transistor 102 is coupled to $V_{DD}$. A clock input is coupled to a control input of transistor 104. A first electrode of transistor 104 is coupled to $V_{DD}$. A second electrode of transistor 102 is coupled to a electrode of transistor 104, and input of inverter 106, and a first electrode of transistor 108. An output of inverter 106 is coupled to a control input of transistor 102. Furthermore, the output of inverter 106 provides an out signal. A data signal is provided to a control input of transistor 108. A second electrode of transistor 108 is coupled to a first electrode of transistor 110. A second electrode 110 is coupled to $V_{gnd}$. A control electrode of transistor 110 is coupled to the clock signal.

Figure 2:
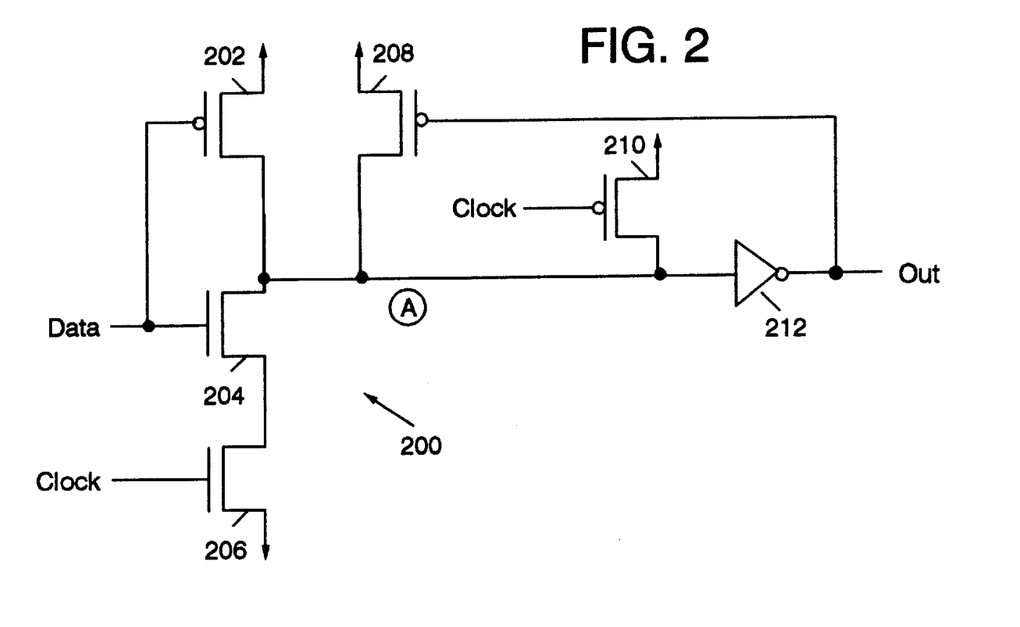
FIG. 2 illustrates, in circuit diagram form, a buffer circuit.

FIG. 2 illustrates a buffer 200. Buffer 200 comprises a first transistor 202, a second transistor 204, a third transistor 206, a fourth transistor 208, a fifth transistor 210, and an inverter 212. A first electrode of transistor 202 is coupled to $V_{DD}$. A control electrode of transistor 202 and a control electrode of transistor 204 are coupled to a Data signal. A second electrode of transistor 202 is coupled to a first electrode of transistor 204. A second electrode of transistor 204 is coupled to a first electrode of transistor 206. A clock signal is input to a control electrode of transistor 206. A second electrode of transistor 206 is coupled to $V_{gnd}$. The second electrode of transistor 202 is coupled to a first electrode of transistor 208. A second electrode of transistor 208 is coupled to $V_{DD}$. A first electrode of transistor 210 is coupled to $V_{DD}$ and a second electrode of transistor 210 is coupled to a second electrode of transistor 208 and an input of inverter 212. A control electrode of transistor 210 is coupled to the clock signal. An output of inverter 212 provides an Out signal and is coupled to a control electrode of transistor 208.

Figure 3:
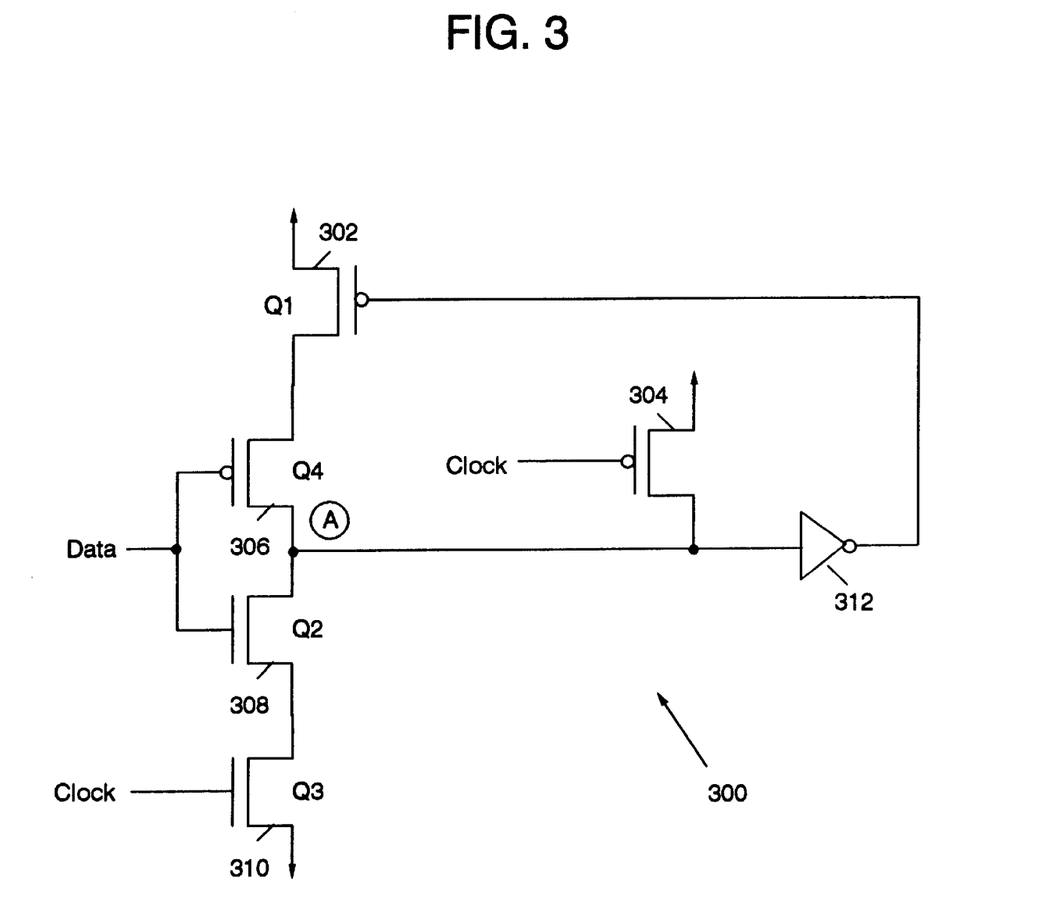
FIG. 3 illustrates, in circuit diagram form, a buffer circuit in accordance with one embodiment of the present invention.

FIG. 3 illustrates a buffer 300 in accordance with the present invention. Buffer 300 comprises a transistor 302, a transistor 304, a transistor 306, a transistor 308, a transistor 310, and an inverter 312. A first electrode of transistor 302 is coupled to $V_{DD}$. A second electrode of transistor 302 is coupled to a first electrode of transistor 306. A data signal is coupled to a control input of transistor 306 and a control electrode of transistor 308. A second electrode of transistor 306 is coupled to a first electrode of transistor 308, a first electrode of transistor 304, and an input of inverter 312. A second electrode of transistor 308 is coupled to a first electrode of transistor 310. A clock input is coupled to a control electrode of transistor 310 and a second electrode of transistor 310 is coupled to $V_{gnd}$. A second electrode of transistor 304 is coupled to $V_{DD}$. A control electrode of transistor 304 is coupled to the clock signal. An output of inverter 312 provides an out signal which is coupled to a control electrode of transistor 302.

Figure 4:
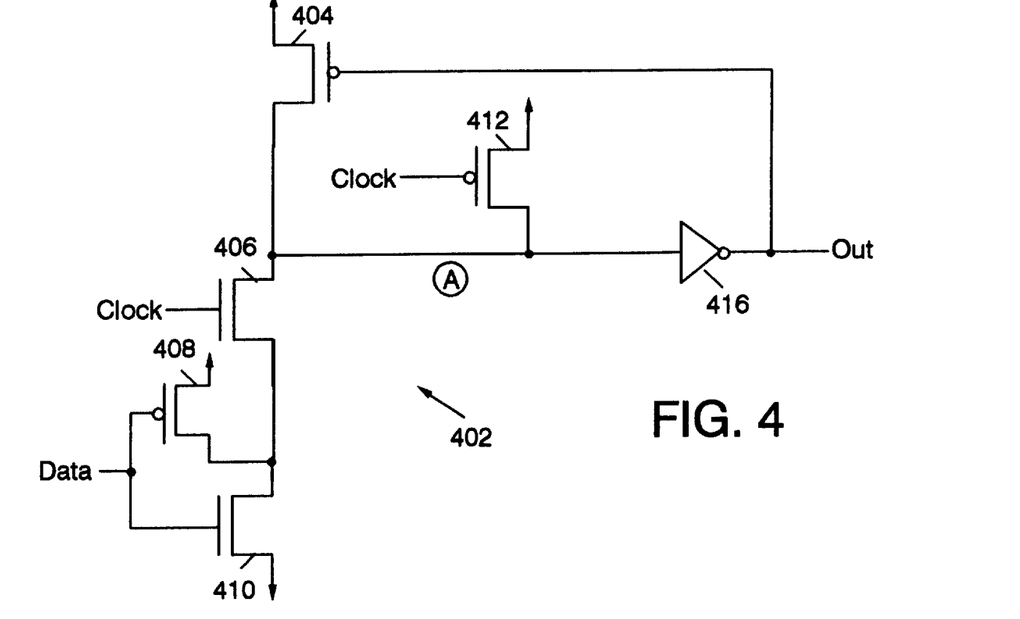
FIG. 4 illustrates, in circuit diagram form, a configuration of a buffer circuit.

FIG. 4 illustrates a dynamic buffer circuit 402. Circuit 402 comprises a first transistor 404, a second transistor 406, a third transistor 408, a fourth transistor 410, a fifth transistor 412, and an inverter 416. A Data signal is coupled to a control electrode of transistor 408 and a control electrode of transistor 410. A first electrode of transistor 410 is coupled to $V_{gnd}$. A second electrode of transistor 410 is coupled to a first electrode of transistor 408 and a first electrode of transistor 406. A second electrode of transistor 408 is coupled to $V_{DD}$. A second electrode of transistor 406 is coupled to a first electrode of transistor 404. A clock signal is coupled to a control electrode of transistor 406. The clock signal is also coupled to a control electrode of transistor 412. A first electrode of transistor 412 is coupled to $V_{DD}$ and a second electrode of transistor 412 is coupled to an input of inverter 416. An output of inverter 416 is coupled to a control electrode of transistor 404. The output of inverter 416 provides an Out signal.

Figure 5:
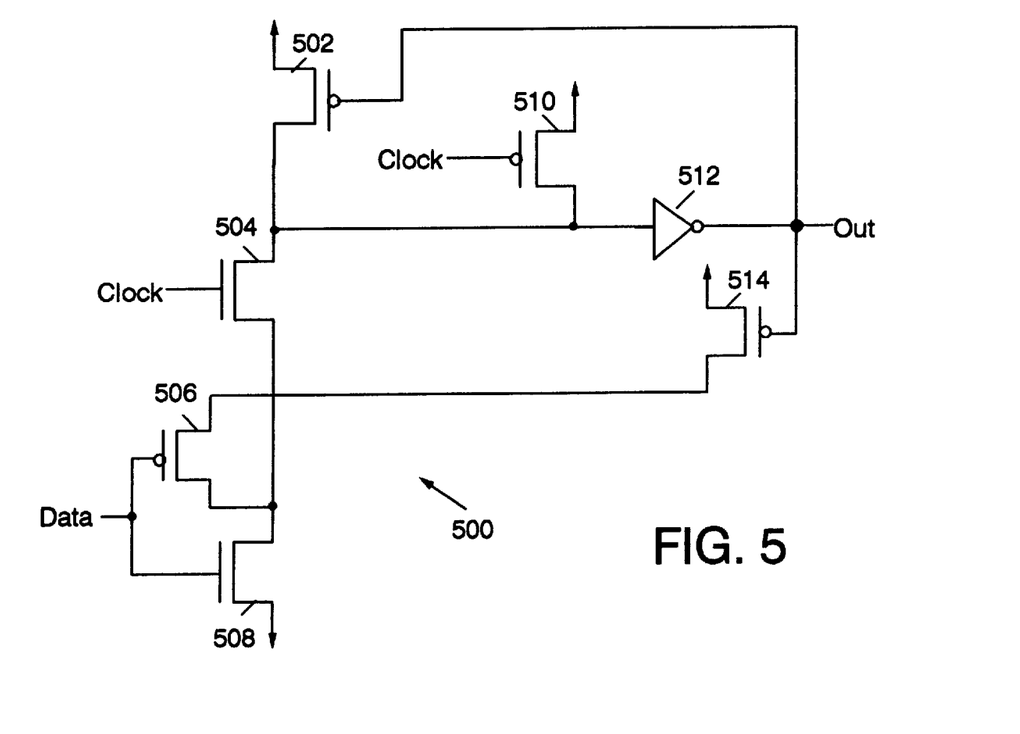
FIG. 5 illustrates, in circuit diagram form, a configuration of a buffer circuit in accordance with one embodiment of the present invention.

FIG. 5 illustrates a dynamic buffer circuit 500 in accordance with one embodiment of the present invention. Circuit 500 comprises a transistor 502, a transistor 504, a transistor 506, a transistor 508, a transistor 510, an inverter 512, and a transistor 514. A first electrode of transistor 502 is coupled to $V_{DD}$. A second electrode of transistor 502 is coupled to a first electrode of transistor 504. A control electrode of transistor 504 is coupled to a Clock signal and a second electrode of transistor 504 is coupled to a first electrode of transistor 506. A control electrode of transistor 506 and a control electrode of transistor 508 are coupled to a data signal. A second electrode of transistor 506 is coupled to a first electrode of transistor 514. The first electrode of transistor 506 is coupled to a first electrode of transistor 514. The first electrode of transistor 506 is coupled to a first electrode of transistor 508 and a second electrode of transistor 508 is coupled to $V_{gnd}$. A second electrode of transistor 514 is coupled to $V_{DD}$. A second electrode of transistor 502 is coupled to a first electrode of transistor 510 and an input of inverter 512. A clock signal is coupled to a control electrode of transistor 510. A second electrode of transistor 510 is coupled to $V_{DD}$. An output of inverter 512 is coupled to a control electrode of transistor 502, a control electrode of transistor 514, and provides an Out signal.

Figure 9:
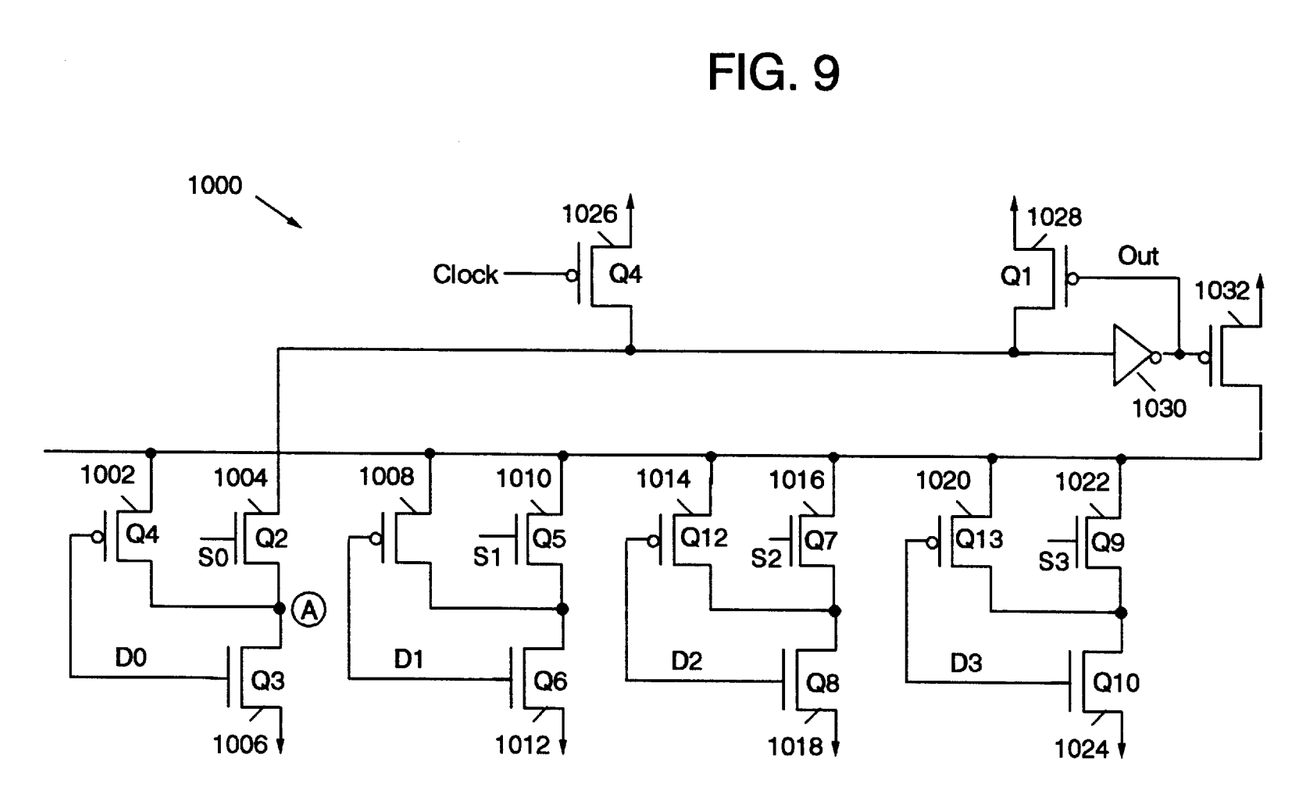
FIG. 9 illustrates, in circuit diagram form, a multiplexer in accordance with one embodiment of the present invention.

FIG. 9 illustrates 4:1 multiplexer circuit 1000 in accordance with one embodiment of the present invention. Multiplexer 1000 comprises a transistor 1002, a transistor 1004, a transistor 1006, a transistor 1008, a transistor 1010, a transistor 1012, a transistor 1014, a transistor 1016, a transistor 1018, a transistor 1020, a transistor 1022, a transistor 1024, a transistor 1026, a transistor 1028, an inverter 1030, and a transistor 1032. A D0 signal is coupled to a control electrode of transistor 1002 and a control electrode of transistor 1006. A first electrode of transistor 1006 is coupled to $V_{gnd}$. A second electrode of transistor 1006 is coupled to a first electrode of transistor 1002 and a first electrode of transistor 1004. A second electrode of transistor 1002 is coupled to a first electrode of transistor 1008, a first electrode of transistor 1014, a first electrode of transistor 1020, and a first electrode of transistor 1032.

A D1 signal is coupled to a control electrode of transistor 1008 and a control electrode of transistor 1012. A second electrode of transistor 1008 is coupled to a first electrode of transistor 1010 and a first electrode of transistor 1012. A second electrode of transistor 1012 is coupled to $V_{gnd}$. A second electrode of transistor 1010 is coupled to a second electrode of transistor 1004, a first electrode of transistor 1026, a first electrode of transistor 1016, a first electrode of transistor 1022, and an input of inverter 1030. An S1 is coupled to a control electrode of transistor 1010.

A D2 signal is coupled to a control electrode of transistor 1014 and a control electrode of transistor 1018. An S2 signal is coupled to a control electrode of transistor 1016. A second electrode of transistor 1014 is coupled to a first electrode of transistor 1018. A second electrode of transistor 1018 is coupled to $V_{gnd}$. The second electrode of transistor 1014 is also coupled to a second electrode of transistor 1016.

A D3 signal is coupled to a control electrode of transistor 1020 and a control electrode of transistor 1024. A second electrode of transistor 1020 is coupled to a second electrode of transistor 1022 and a first electrode of transistor 1024. A second electrode of transistor 1024 is coupled to $V_{gnd}$. An S3 signal is coupled to a control electrode of transistor 1022. An output of inverter 1030 is coupled to a control input of transistor 1028. A second electrode of transistor 1028 is coupled to $V_{DD}$. A clock signal is coupled to a control electrode of transistor 1026. A second electrode of transistor 1026 is coupled to $V_{DD}$. The output of inverter 1030 is coupled to a control electrode of transistor 1032. A second electrode of transistor 1032 is coupled to $V_{DD}$.

Description of operation of each of the circuits previously described will now be provided in greater detail.

Description of Operation

As previously mentioned, the present invention provides a circuit which improves the noise immunity characteristics of dynamic circuits, including domino logic circuits. Standard domino and dynamic logic circuits have a noise margin which is purely dominated by a transistor threshold voltage. To illustrate this domination and the problems associated therewith, refer to FIG. 1.

FIG. 1 illustrates a standard dynamic buffer circuit. In prior art buffer circuit 100, a node labeled "A" is precharged to a logic high value during a first phase of a clock signal. As the clock signal goes to a logic low level, transistor 104 begins conducting and precharges node A to a predetermined voltage value. If, after a next rising edge of the clock signal, noise is introduced on the Data signal which rises above the threshold voltage of transistor 108, transistor 108 will be enabled, along with transistor 110 to conduct current such that node A is pulled to a low logic level. As the threshold voltage is typically only 15% of a supply voltage, noise introduced on the Data signal may often exceed this value. In current technologies with a 0.35 micrometer channel length, the supply voltage is typically 3.3 volts and the threshold voltage is 0.5 volts. Newer technologies have lower power supplies and, therefore, lower threshold voltages. Therefore, due to processing variations during the manufacturing phases of the circuit, the threshold voltage may, in fact, be even lower than 0.5 volts. In this case, the dynamic logic circuit has an increased sensitivity to noise which will result in the logic circuit providing an erroneous output.

FIG. 2 illustrates a dynamic buffer circuit. In buffer circuit 200, a node labeled "A" is precharged to a logic high value during the first phase of a clock signal As the clock signal goes to a logic low level, transistor 412 begins conducting and precharges node A to the supply voltage value. If after a next rising edge of a clock signal noise is introduced on a the data line which rises above a threshold voltage of transistor 204, buffer circuit 200 does not immediately discharge transistor 204. Rather, transistor 202 continues to conduct such that node A remains precharged for an additional period of time. However, in buffer circuit 200, it should be noted that if the data signal goes to a logic low level, or it is reset, the Out signal provided by buffer circuit 200 will also go to a logic low level. Thus, the use of transistor 202 will cause an output to decay and not remain asserted until a next clock falling edge, as is the expected behavior of domino circuits. Furthermore, in the buffer circuit 200, large amounts of power are dissipated during a slow transition in which a dynamic node is precharged to a logic high level.

The present invention maintains the functionality of dynamic circuits and avoids the sensitivity to noise and dependence on threshold voltage by setting a noise immunity of a circuit using a ratio of two device widths. FIG. 3 illustrates a buffer circuit which implements the present invention to reduce a noise sensitivity of the circuit. In the buffer circuit of the present invention, a transistor 302 is included to prevent the early reset of the output of the buffer circuit. During operation of the buffer circuit 300 in FIG. 3, when the clock signal is a logic low level, transistor 304 is enabled to pull node A to the supply voltage level. Stated another way, node A is precharged when the clock signal is a logic low value. Subsequently, when the clock signal rises to a logic high level, node A remains at a logic high level until a voltage level of the data signal being input thereto rises to a value over the threshold value of transistor 308, wherein that value is determined by a ratio of the width of transistor 306 to a width of transistor 308.

To illustrate operation of the buffer circuit of the present invention, assume that node A has been precharged and that the clock signal is now asserted. When the clock signal is asserted, transistor 310 is enabled to pull node A to a logic low value when transistor 308 is also enabled. Transistor 302 remains enabled to pull node A to a logic high level when transistor 306 is enabled. As transistor 306 is a p-type transistor, when the data signal has a logic low value, transistor 306 is enabled to conduct and node A will be pulled to a logic high level. However, when the data signal has a logic high value, transistor 308 is enabled and node A is pulled to a logic low value.

While operation of the circuit is fairly straight forward when logic high and logic true values are provided thereto, operation becomes less predictable when noise is introduced on the data signal. When noise on the data signal meets or exceeds the threshold voltage of transistor 308, the presence of transistor 306 will not enable transistor 308 to pull node A to a logic low value. Transistor 306 functions in this manner because, while a threshold voltage of transistor 308 is present on the data signal, transistor 306 remains conductive and continues to pull node A to a logic high level. Essentially, transistors 306 and 308 form a resistor divider which may be used to increase the noise immunity of the buffer circuit, even though the circuit is dynamic.

In addition to the decreased noise sensitivity of the circuit of the present invention, it should be noted that the functionality of dynamic node A is preserved. Stated another way, once the dynamic node has discharged, the data input signal may go to a logic low level without node A being precharged or the circuit illustrated therein being reset as is illustrated in the example of FIG. 2. The premature reset operation is prevented because transistor 302 has been disabled.

Figure 6:
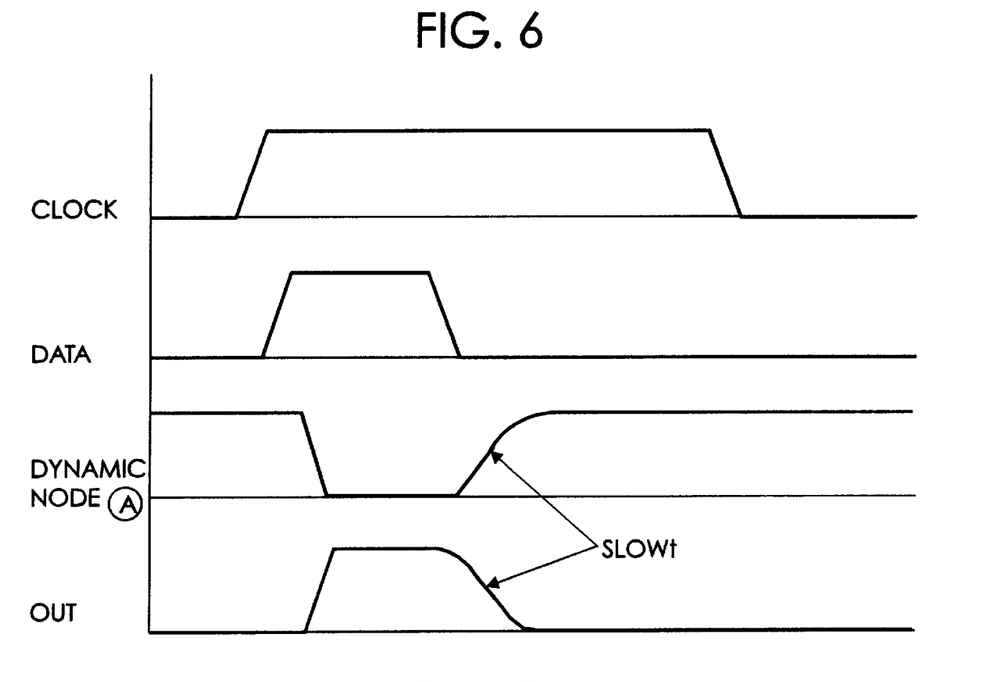
FIG. 6 illustrates, in timing diagram form, a relationship between input and output signals of a configuration of FIG. 4.

To further illustrate the present invention, FIG. 4 provides another dynamic buffer circuit 402. While the circuit illustrated in FIG. 2 provides some noise immunity, the dynamic buffer circuit illustrated therein may be susceptible to race conditions when the data signal transitions from a logic high to a logic low state. A timing diagram in FIG. 6 illustrates operation of a dynamic buffer circuits 200 and 402. As may be observed from FIG. 6, when the data signal goes to a logic low level, dynamic node A slowly precharges to a logic high value. In response thereto, the Out signal slowly discharges to a logic low value. The slow transitions of both dynamic node 400 and the Out signal result in significant power dissipation which may be crucial to today's low power and portable applications.

As has been previously explained, in domino and dynamic circuits, an output of the circuit remains high until a clock signal is negated. Thus, while the implementation of the dynamic circuit 402 illustrated in FIG. 4 provides some protection against noise sensitivity, dynamic circuit 402 deviates from the expected behavior of domino and dynamic circuits because a dynamic node is slowly precharged when a data value goes to a logic low level. Furthermore, an effect of the negation of the Data signal on the output of the domino circuit adversely effects circuits receiving the signal. Upon the negation of the Out signal, such circuits may even reset unexpectedly. Additionally, as previously mentioned, large amounts of power are dissipated during the slow transition on the dynamic node and the Out signal.

Figure 7:
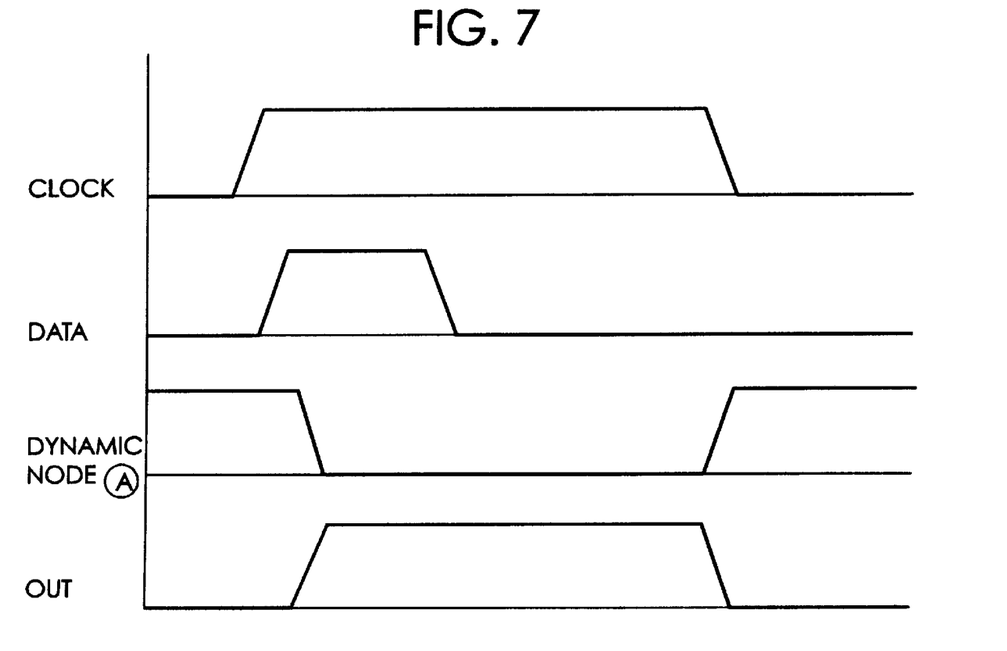
FIG. 7 illustrates, in timing diagram form, a relationship between input and output signals of a circuit in accordance with one embodiment of the present invention.

In contrast, FIGS. 3 and 5 illustrate a dynamic circuit implemented in accordance with the present invention. Dynamic circuit 500 implements a transistor 514 which allows a dynamic node to stay at a logic low level and, therefore, the Out signal to remain at a logic high level until a clock signal is negated. Thus, through the use of transistor 302 in FIG. 3 and transistor 514 in FIG. 5 in one embodiment of the present invention, a dynamic circuit is implemented which is able to have greater noise immunity from noise on an input signal, while complying with expected behavior of dynamic circuits. FIG. 7 provides a timing diagram for the operation of the circuit of FIG. 5.

Figure 8:
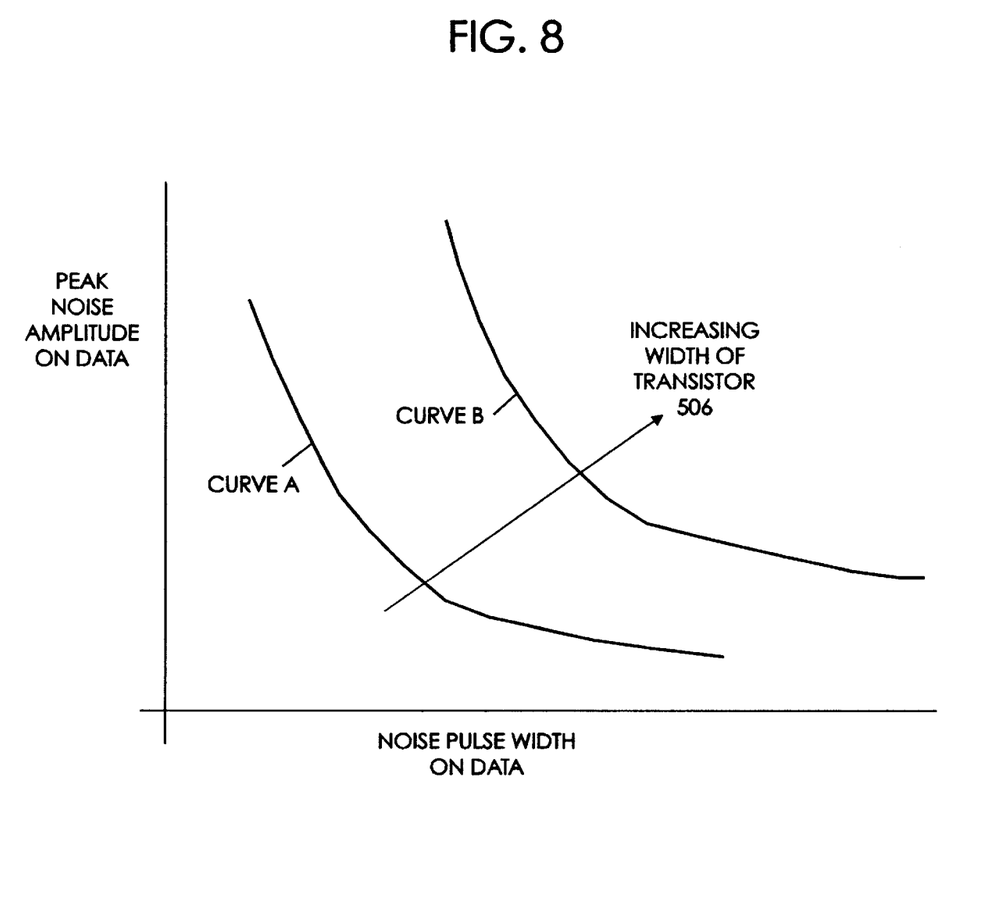
FIG. 8 illustrates, in graphical form, a relationship between a beta ratio and an output voltage of a circuit in accordance with one embodiment of the present invention.

FIG. 8 illustrates the manner in which the invention can be used to increase the noise immunity of a circuit. A noise pulse is typically characterized by a peak amplitude and pulse width or duration. A circuit may not be susceptible to a noise pulse of a given amplitude if the duration of the noise is short; however, a pulse of the same amplitude with a longer duration may cause the circuit to fail. Thus, the noise margin of a circuit is typically plotted as a curve with the vertical axis indicating the peak amplitude of the noise pulse and the horizontal axis indicating the pulse width or duration. A noise pulse characterized by an amplitude and pulse width lying below the curve does not cause the circuit to fail. While a noise pulse characterized by an amplitude and pulse width lying above the curve does cause the circuit to fail.

FIG. 8 illustrates two such curves. Curve A represents the noise immunity of the circuit in FIG. 5 for a given width of transistor 506. Increasing the width of transistor 506 shifts the noise immunity curve upward, indicating that the circuit is less susceptible to noise, i.e., at a given pulse width the noise pulse must achieve a greater amplitude for the circuit to fail. Curve B represents the noise immunity of the same circuit as curve A, except that the width of transistor 506 has been increased.

Lastly, FIG. 9 illustrates another embodiment of a circuit which implements the present invention. FIG. 9 illustrates a multiplexer which has four select inputs, S0, S1, S2, and S3, and four data inputs, D0, D1, D2, and D3. In operation of the multiplexer, select signals are typically not as noisy as data signals and, therefore, the present invention is not applied thereto. It should be noted that multiplexer 1000 of FIG. 9 still implements a half latch to give noise immunity to the select lines, S0 through S3. Because the select lines are typically less noisy than the data lines, the half latch is typically sufficient to give noise immunity.

During operation of multiplexer circuit 1000, during a first phase of the clock input signal, when the clock input is a logic low value, each of transistors 1004, 1010, 1016, and 1022 is precharged to a logic high level via transistor 1026. During operation, each of transistors 1002, 1008, 1014, and 1020 function to give greater noise immunity. As previously described, noise on each data input signals, D0 through D3, must rise above a switching voltage determined by the ratio of the width of transistors 1006, 1012, 1018, and 1024 to the width of transistors 1002, 1008, 1014, and 1020, respectively.

During a first example of operation of multiplexer 1000, assume only one of the S0 through S3 signals may be asserted in one embodiment of the present invention. When this is the case, the D0 data signal cannot cause the Out signs of the multiplexer to switch from a first to a second logic level until transistor 1006 overcomes the effects of the series combination of transistors 1002 and 1028. Thus, in this embodiment of the present invention, a noise margin may be set via a strength of p-channel transistors in series in the circuit. Additionally, in the embodiment of the invention described herein, charge sharing is also eliminated.

Additionally, FIG. 9 may be viewed as a logical AND-OR logic circuit. In this AND-OR logic circuit, each of the select signals may be asserted concurrently. When the logic circuit 1000 of FIG. 9 is used to reform a logical AND-OR function, one or more of the select signals, S0 through S3, may be asserted concurrently. Assume, in an example, that data input signal D0, and select input signals S0 through S1, are all enabled, and data signals D1, D2, and D3 are disabled. In this case, a pull down path by which node A would be discharged using transistor 1006, is being countered by a strength of transistor 1028, in series with transistors 1008, 1014, and 1020. Thus, the maximum pull-up strength that must be overcome by the pull-down transistor is limited by the width of transistor 1032.

It should be noted that there are many additional configurations for implementing the invention described above. Therefore, while there have been described therein the principles of the invention, it is to be clearly understood to those skilled in the art that this description is made by way of example only and not as a limitation to the scope of the invention. Accordingly, it is intended, by the appended claims, to cover all modifications of the invention which fall within the true spirit and scope of the invention.

What is claimed is:

1. A dynamic circuit, comprising:
    an input means for receiving an input signal, comprising:
        a first transistor having a first electrode, a second electrode, and a control electrode coupled to the input signal;
        a second transistor having a first electrode coupled to the second electrode of the first transistor, a second electrode, and a control electrode coupled to the input signal;
    a clock means for receiving a clock signal, comprising:
        a third transistor having a first electrode coupled to the second electrode of the second transistor, a second electrode coupled to a ground reference voltage, and a control electrode coupled to the clock signal;
        a fourth transistor having a first electrode coupled to a first power reference voltage, a second electrode coupled to the second electrode of the first transistor, and a control electrode coupled to the clock signal; and
    a feedback means for generating an output signal, comprising:
        an inverter having an input coupled to the second electrode of the fourth transistor and an output for providing the output signal; and
        a fifth transistor having a first electrode coupled to a second power reference voltage, a second electrode coupled to a first electrode of the first transistor, and a control electrode coupled to the output of the inverter.

2. The dynamic circuit of claim 1 wherein a dynamic node of the dynamic circuit is a connection between the second electrode of the first transistor and the first electrode of the second transistor.

3. The dynamic circuit of claim 2 wherein the dynamic node is discharged to a first voltage level when the input signal has a second voltage level.

4. The dynamic circuit of claim 3 wherein a ratio between a width of the first transistor and a width of the third transistor determines the second voltage level.

5. A dynamic circuit, comprising:
    an input means for receiving an input signal, comprising:
        a first transistor having a first electrode, a second electrode, and a control electrode coupled to the input signal;
        a second transistor having a first electrode coupled to the second electrode of the first transistor, a second electrode coupled to a first reference ground voltage, and a control electrode coupled to the input signal; and
        a third transistor having a first electrode coupled to a first power reference voltage, a second electrode coupled to the first electrode of the first transistor, and a control electrode;
    a clock means for receiving a clock signal, comprising:
        a fourth transistor having a first electrode, a second electrode coupled to the second electrode of the first transistor, and a control electrode coupled to the clock signal;
        a fifth transistor having a first electrode coupled to a second power reference voltage, a second electrode coupled to the first electrode of the fourth transistor, and a control electrode coupled to the clock signal; and
    a feedback means for generating an output signal, comprising:
        an inverter having an input coupled to the second electrode of the fifth transistor and an output coupled to the control electrode of the third transistor for providing the output signal; and
        a sixth transistor having a first electrode coupled to a third power reference voltage, a second electrode coupled to a first electrode of the fourth transistor, and a control electrode coupled to the output of the inverter.

6. The dynamic circuit of claim 5 wherein the dynamic circuit performs a logical AND function.

7. A dynamic circuit, comprising:
    an input means for receiving an input signal, comprising:
        a first transistor having a first electrode, a second electrode, and a control electrode coupled to the input signal;
        a second transistor having a first electrode coupled to the second electrode of the first transistor, a second electrode coupled to a first reference ground voltage, and a control electrode coupled to the input signal; and
        a third transistor having a first electrode coupled to a first power reference voltage, a second electrode coupled to the first electrode of the first transistor, and a control electrode,
    a clock means for receiving a clock signal, comprising:
        a fourth transistor having a first electrode coupled to a second power reference voltage, and a control electrode coupled to the clock signal, and
    a feedback means for generating an output signal, comprising:
        an inverter having an input coupled to a second electrode of the fourth transistor and an output coupled to the control electrode of the third transistor for providing the output signal; and
        a fifth transistor having a first electrode coupled to a third power reference voltage, a second electrode coupled to the input of the inverter, and a control electrode coupled to the output of the inverter; and
        a sixth transistor having a first electrode coupled to the input of the inverter, a second electrode coupled to the first electrode of the second transistor and a control electrode coupled to the clock signal.

* * * * *